(12) United States Patent
Adriany et al.

(10) Patent No.: US 7,514,926 B2
(45) Date of Patent: Apr. 7, 2009

(54) SPATIALLY RECONFIGURABLE MAGNETIC RESONANCE COIL

(75) Inventors: Gregor Adriany, Minneapolis, MN (US); Pierre-Francois Van de Moortele, Minneapolis, MN (US); Johannes Ritter, St. Louis Park, MN (US); William Voje, Newport, MN (US); J. Thomas Vaughan, Stillwater, MN (US); Kamil Ugurbil, Minneapolis, MN (US)

(73) Assignee: Regents of the University of Minnesota, St. Paul, MN (US)

( * ) Notice: Subject to any disclaimer, the term of this patent is extended or adjusted under 35 U.S.C. 154(b) by 1 day.

(21) Appl. No.: 11/599,177

(22) Filed: Nov. 14, 2006

(65) Prior Publication Data

US 2007/0108980 A1    May 17, 2007

Related U.S. Application Data

(60) Provisional application No. 60/736,543, filed on Nov. 14, 2005.

(51) Int. Cl.
  *G01V 3/00* (2006.01)
(52) U.S. Cl. ..................................... 324/318
(58) Field of Classification Search .................. 324/318
  See application file for complete search history.

(56) References Cited

U.S. PATENT DOCUMENTS

| | | | | |
|---|---|---|---|---|
| 5,886,596 A | * | 3/1999 | Vaughan, Jr. | ................ 333/219 |
| 6,236,206 B1 | * | 5/2001 | Hartman et al. | ............. 324/318 |
| 6,429,657 B1 | * | 8/2002 | Blish, II | ..................... 324/322 |

OTHER PUBLICATIONS

Adriany, G., et al., "Transmit and Receive Transmission Line Arrays for 7 Tesla Parallel Imaging", *Magnetic Resonance in Medicine*, 53(2), (2005),434-445.

Katscher, U. , et al., "Transmit SENSE", *Magnetic Resonance in Medicine*, 49(1), (2003),144-150.

Lee, R. F., et al., "Coupling and Decoupling Theory and Its Application to the MRI Phased Array", *Magnetic Resonance in Medicine*, 48(1), (2002),203-213.

Lee, R. F., et al., "Lumped-Element Planar Strip Array (LPSA) for Parallel MRI", *Magnetic Resonance in Medicine*, 51(1), (2004),172-183.

Li, B. K., et al., "Focused, Eight-Element Transceive Phased Array Coil for Parallel Magnetic Resonance Imaging of the Chest—Theoretical Considerations", *Magnetic Resonance in Medicine*, 53(6), (2005),1251-1257.

(Continued)

*Primary Examiner*—Brij B. Shrivastav
*Assistant Examiner*—Megann E Vaughn
(74) *Attorney, Agent, or Firm*—Crompton, Seager & Tufte LLC

(57) ABSTRACT

This document discusses, among other things, a system and method for a coil having a plurality of resonant elements and an adjustable frame. A position of at least one resonant element can be adjusted relative to at least one other resonant element. A variable impedance is coupled to adjacent resonant elements and the impedance varies as a function of a separation distance. Cables are coupled to each resonant element and are gathered at a junction in a particular manner.

26 Claims, 10 Drawing Sheets

OTHER PUBLICATIONS

Pinkerton, R. G., et al., "Noise Properties of a NMR Transceiver Coil Array", *Journal of Magnetic Resonance*, 171(1), (2004),151-156.

Pruessmann, K. P., "SENSE: Sensitivity Encoding for Fast MRI", *Magnetic Resonance in Medicine*, 42(5), (1999),952-962.

Roemer, P. B., et al., "The NMR Phased Array", *Magnetic Resonance in Medicine*, 16(2), (1990),192-225.

Ullmann, P., et al., "Experimental Analysis of Parallel Excitation Using Dedicated Coil Setups and Simultaneous RF Transmission on Multiple Channels", *Magnetic Resonance in Medicine*, 54(4), (2005),994-1001.

Vaughan, J. T., et al., "Efficient High-Frequency Body Coil for High-Field MRI", *Magnetic Resonance in Medicine*, 52(4), (2004),851-859.

U.S. Appl. No. 60/135,269, filed May 21, 1999, Vaughan, J. T., "RF Coil For Imaging System and Use Therein".

Wiesinger, F., et al., "Parallel Imaging Performance as a Function of Field Strength—An Experimental Investigation Using Electrodynamic Scaling", *Magnetic Resonance in Medicine*, 52(5), (2004),953-964.

Zhu, Y., "Parallel Excitation With an Array of Transmit Coils", *Magnetic Resonance in Medicine*, 51(4), (2004),775-784.

* cited by examiner

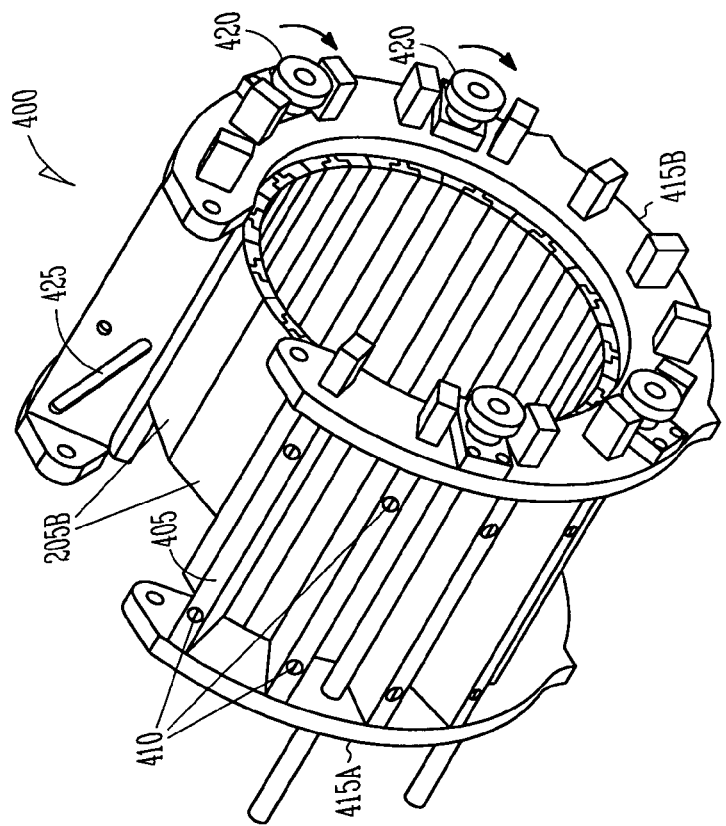
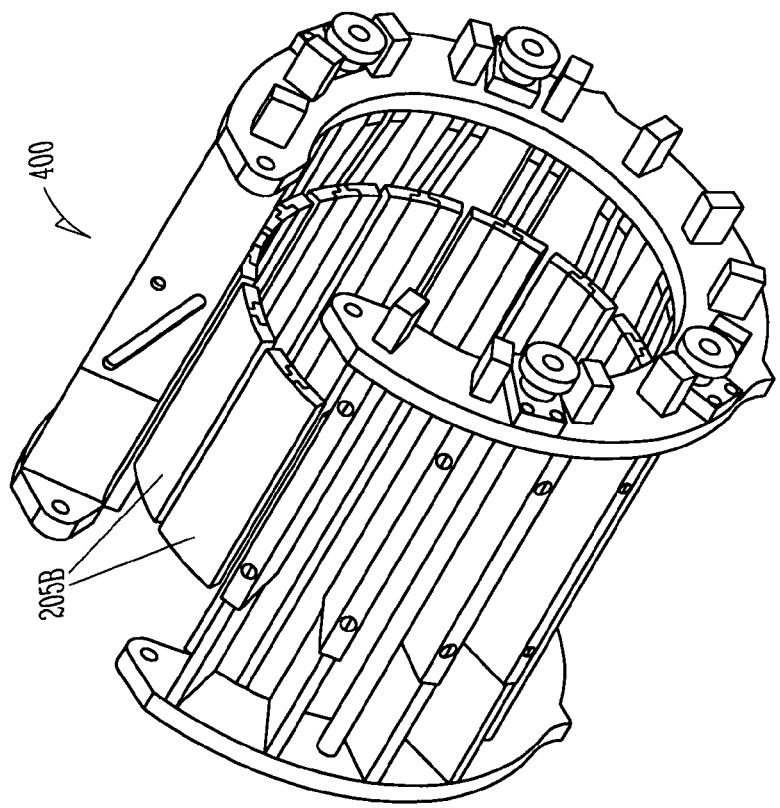

SPATIALLY RECONFIGURABLE MAGNETIC RESONANCE COIL

RELATED APPLICATIONS

This application claims priority under 35 U.S.C. §119(e) to U.S. Provisional Patent Application No. 60/736,543, filed Nov. 14, 2005, which is incorporated herein by reference.

GOVERNMENT INTEREST

This work was supported by NIH grant P41 RR08079, W. M. Keck Foundation, and the MIND Institute, the Keck Foundation, NSF grant 9907842, and NIH grant S10 RR1395. The United States government has certain rights in the technology disclosed herein.

TECHNICAL FIELD

This document pertains generally to a magnetic resonance coil, and more particularly, but not by way of limitation, to a spatially reconfigurable magnetic resonance coil.

BACKGROUND

Magnetic resonance imaging and magnetic resonance spectroscopy involve providing an excitation signal to a specimen and detecting a response signal. The excitation signal is delivered by a transmit coil and the response is detected by a receive coil. In some examples, a single structure is used to both transmit the excitation signal and to receive the response.

Known devices and methods are inadequate.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIGS. 4A and 4B illustrate perspective views of an exemplary coil.

DETAILED DESCRIPTION

The following detailed description includes references to the accompanying drawings, which form a part of the detailed description. The drawings show, by way of illustration, specific embodiments in which the invention may be practiced. These embodiments, which are also referred to herein as "examples," are described in enough detail to enable those skilled in the art to practice the invention. The embodiments may be combined, other embodiments may be utilized, or structural, logical and electrical changes may be made without departing from the scope of the present invention. The following detailed description is, therefore, not to be taken in a limiting sense, and the scope of the present invention is defined by the appended claims and their equivalents.

In this document, the terms "a" or "an" are used, as is common in patent documents, to include one or more than one. In this document, the term "or" is used to refer to a nonexclusive or, unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

The present subject matter relates to a geometrically adjustable multi-channel coil for magnetic resonance imaging and spectroscopy. In one example, the coil includes decoupling capacitors associated with discrete resonant elements of the coil. The decoupling capacitors provide a capacitance value that is a function dependent on proximity to an adjacent resonant element. In one example, a sixteen element head coil, in the form of a volume coil, uses transmission line technology configured for parallel imaging. In addition to a head coil, the present subject matter can be tailored for use as a breast coil, body coil or other type of coil.

Figure 1A:
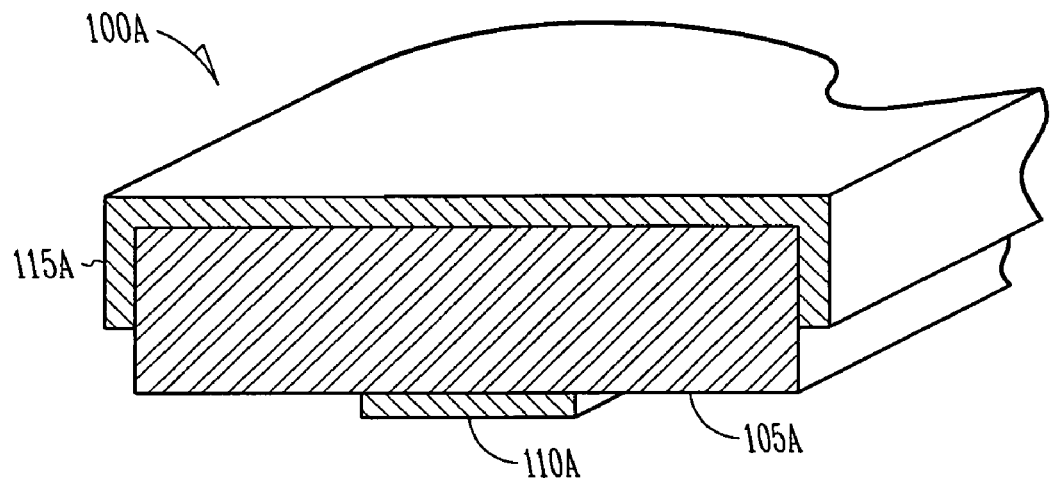
FIGS. 1A and 1B include sectional views of exemplary resonant elements.
Figure 1B:
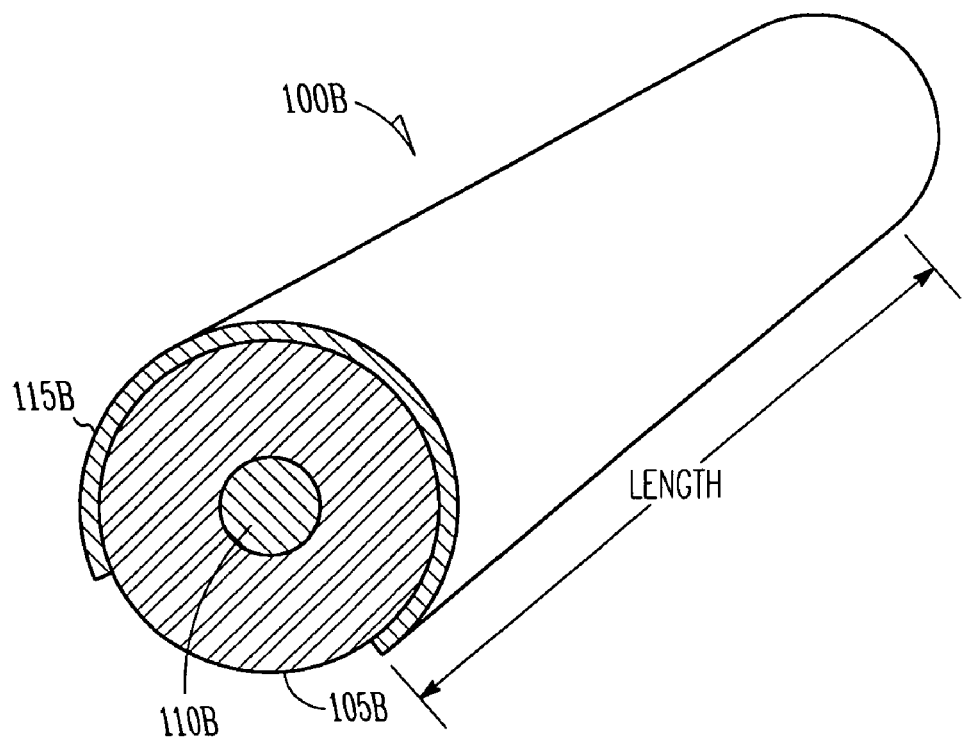

FIGS. 1A and 1B illustrate sectional views of resonant elements according to the present subject matter. A resonant element is an elongate member configured for radio frequency transmission, reception or both transmission and reception. In one example, the resonant element includes a transmission line or other resonant structure having a ground plane and an inner conductor. Resonant element 100A of FIG. 1A illustrates inner conductor 110A and ground plane 115A separated by dielectric 105A. The ground plane can be of planer, faceted, curved or arced cross-section and is of conductive material. Exemplary inner conductors include a center wire on a coaxial line and a single strip of conductive material on a surface of a strip transmission line. The term inner relates to the generally interior portion of the volume coil for which the resonant element is a part. With respect to the generally interior portion, the ground plane is disposed on the exterior portion of the volume coil. Ground plane 115A is disposed on three sides of dielectric 105A and partially encircles inner conductor 110A. Resonant element 100B of FIG. 1B illustrates inner conductor 110B and ground plane 115B separated by dielectric 105B. Resonant element 100B includes a coaxial line having a portion of an insulative ground removed however, other embodiments include a coaxial line with an insulative ground (shield) fully encircling inner conductor 110B. The length of resonant element 100B is indicated in the figure.

In one example, a resonant element includes a waveguide having a cavity in which radio frequency resonance can be established. Other resonant elements are also contemplated. The adjustable elements of the coil provide, in various embodiments of the present subject matter, improved imaging performance, improved radio frequency transmit efficiency and improved signal-to-noise ratio in a closer fitting coil.

A multi-element transmit coil, or array system, according to the present subject matter, is particularly suited for use in a high field application. Each element, or resonant element, corresponds to a channel and each channel, in one example, is operated independent of other channels. The array system can be used for radio frequency transmission, reception or both transmission and reception.

A coil with multi-channel transmit capability for independent phase and amplitude control of its elements can be used for radio frequency shimming to mitigate sample-induced radio frequency non-uniformities. Such an array can be used as a transmitter for parallel imaging and can be combined with receive-only arrays by using preamplifier decoupling for the coils during signal reception. In one example, a 32-element radially configured transmit array head coil is based on transmission line elements operating at high frequencies. Such an array provides electromagnetic decoupling, avoids resonance peak splitting and maintains transmit efficiency. Strong coupling between the sample, or specimen, and the coil at high RF frequencies, complicates equalizing of individual resonance elements performance for different subjects and varying specimen or head positions in the RF coil array.

Improved radio frequency transmit efficiency and signal to noise ratio (SNR) can be achieved by a coil according to the present subject matter, which allows for adjustment of the coil geometry depending on the head size or sample size. In one example, the present subject matter improves the filling factor and the higher B1 located closer to the coil conductor is better utilized. In one example, the present subject matter achieves a more balanced spacing between the subject and the individual resonance elements and thus provides a more even unloaded-to-loaded Q-ratio between the different resonance elements. An example of the present subject matter provides substantially equalized match capacitor values and a reduced coil input circuitry phase variation.

For a linear transmission line element, sensitive points for lumped element decoupling options are capacitors between neighboring elements at the feed ends of the conductor strips. In this way, a fraction of the feed current with the proper phase can be diverted into the neighboring resonance element to compensate for mutual inductance. Decoupling capacitors between immediate neighboring transmission lines can provide array element decoupling between any two array elements.

A decoupling network for a fixed geometry coil is typically configured once and remains suitable indefinitely. The decoupling network in one example of the present subject matter is configured to adjust automatically according to the adjustable geometry of the coil. The decoupling network allows automatic reconfiguration when switching coil geometries for different subjects.

In the present subject matter, the decoupling capacitor value adjustment depends on coil geometry and allows for self-adjusting impedance, where the impedance value is a function of the relative distance between the immediate neighbor elements. In various examples, the decoupling network includes at least one capacitor, at least one inductor or both capacitors and inductors. In one example, a patch capacitor allows for either linear or non-linear adjustment of the decoupling capacitance depending on the resonance element distance and geometry. In one example, a 16-element decoupled transceiver array allows for flexibly adjustable coil geometry and provides parallel imaging and RF shimming capability at 7 Tesla.

An exemplary coil includes 16-channels that are geometrically adjustable transmission line arrays (coils). Coil 200 illustrated in FIG. 2 includes 12-channels. In the example illustrated in the figure, resonant elements 205B are shorter and resonant elements 205A are longer (8 cm and 14 cm, respectively) and configured in the form of a volume coil. The short resonant elements provides access to reduce claustrophobic effects of the coil on a subject and also provides access for viewing or manipulating objects located in the interior of the coil. For the example illustrated, the coil size is user-adjustable between a minimum interior size of 17 cm by 21 cm and a maximum interior size of 21 cm by 25 cm. Coils having a number of channels greater or fewer than twelve and sixteen are also contemplated, including, for example, a 32-channel coil. In one example, a 64-channel coil includes 64 resonant elements arranged in sixteen rows of four resonant elements per row with each resonant element decoupled from an adjacent resonant element. In one example, at least one resonant element of a coil has a fixed or adjustable curvature to allow conformance to a curved contour of a sample. In various examples, one or more resonant elements are of a length different from that of another resonant element.

In one example, a coil has two short resonant element (10 cm) and fourteen longer resonant elements (14 cm), also in the form of a volume coil. In one example, the coil size is user-adjustable between a minimum interior size of 16 cm by 22 cm and a maximum interior size of 20 cm by 26 cm.

The resonance elements are fabricated of adhesive-backed copper tape (3M, Minneapolis, Minn.) and dielectric material having dimensions of, for example, 4 cm by 1.2 cm by 18 cm. The dielectric material is an insulating polymer such as a fluorinated polymer, PTFE, PFA, tetrafluoroethylene, polytef (polytetrafluoroethylene) or a fluorocarbon resin (FEP—Fluorinated ethylene-propylene or TFE—Tetrafluoroethylene). In one example, the capacitors, including the variable tune and match capacitors (NMNT 12-6, Voltronic, NJ, USA) and high voltage ceramic chip capacitors (100E series, American Technical Ceramics, NY, USA) are embedded into the dielectric and shielded (covered by a metal foil) to minimize E-field exposure.

In one example, the ground conductor for each resonant element is 4 cm wide and electrically isolated from adjacent elements. To further improve adjacent element decoupling, the ground plane is extended to partially cover the sides of the dielectric material as shown in FIG. 1A. In other examples, the ground plane of a resonant element partially encircles the center conductor as shown in FIG. 1B. Such a configuration reduces coupling with adjacent resonant elements and enhances decoupling, thus enhancing the E-field.

Figure 2:
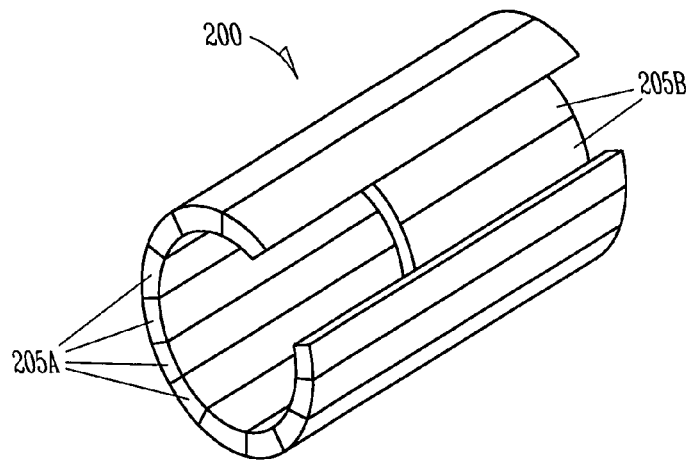
FIG. 2 includes a perspective view of a coil.

To create an opening in a side (for example, at the front of the face), one or more resonant elements are truncated or shortened as shown in FIG. 2. In the example illustrated, the resonant elements are 8 cm in length. The effective electrical length of the remaining resonance elements is 15 cm.

Figure 3:
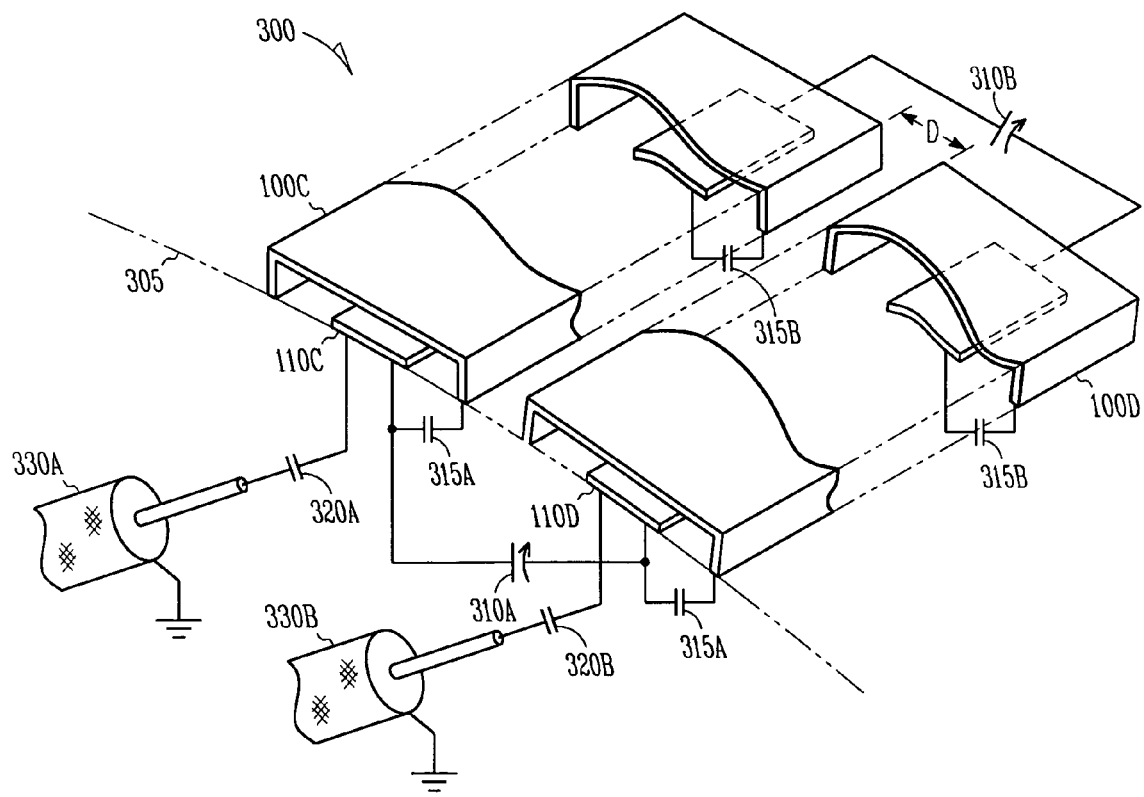
FIG. 3 includes a model of two resonant elements.

In one example, capacitors are coupled between adjacent resonant elements to provide decoupling, as show in FIG. 3. The capacitance of the capacitors varies according to geometrical distance between resonant elements. The capacitors are variously referred to as a patch capacitor. In one example, the capacitive values for decoupling capacitors are in the range of 2.5 pF±1 pF. Other decoupling capacitance values are also contemplated.

FIG. 3 illustrates electrical circuit diagram 300 associated with two exemplary resonant elements in adjacent configuration. The resonant elements have ground planes 100C and 100D and are shown to partially encircle inner conductors 110C and 110D, respectively. The resonant elements lie on curvature 305 and are held in position by a rigid or flexible frame (not shown). Tuning capacitors 315A and 315B are illustrated at each end of the resonant elements and are coupled between the inner conductors 110C and 110D and ground planes 100C and 100D, respectively. Tuning capacitors 315A and 315B are selected to provide sensitivity at a particular resonant frequency. Decoupling capacitors 310A and 310B (variously referred to as patch capacitors) are illustrated at each end of the resonant elements and are coupled between adjacent ground planes 100C and 100D. Decoupling capacitors 310A and 310B are of variable impedance and in one example of the present subject matter, the value is a function of distance D between the resonant elements. In the example illustrated, two decoupling capacitors are shown, however, in other embodiments, a single capacitor (or impedance device) is used and in other embodiments, more than two impedance devices are provided.

Matching capacitors 320A and 320B are coupled between coaxial lines 330A and 330B, respectively and inner conductors 110C and 110D, respectively.

In one example, an adjustable frame allows for individual spatial adjustment of one or more resonant elements. FIGS. 4A and 4B illustrates coil 400 having been adjusted to two positions. In FIG. 4A, coil 400 is at a large size and resonant elements 205B are disposed at a large radial dimension. In FIG. 4B, coil 400 is at a small size and resonant elements 205B are disposed at a small radial dimension. Coil 400 includes end plate 415A and end plate 415B. In the example illustrated, the radial position of resonant elements 205B are a function of the spacing of end plates 415A and 415B, by virtue of angled slot 425. In particular, when end plates 415A and 415B are close, then resonant elements 205B are at a small radial dimension (FIG. 4B) and when end plates 415A and 415B are far apart, then resonant elements 205B are at a large radial dimension (FIG. 4A). The spacing of end plates 415A and 415B are controlled by threaded shafts affixed to knobs 420. Each resonant element 205B is carried by a resonant element holder 405. Knobs 420 allow positioning of the resonant elements at any of a plurality of positions within a range determined by the structure.

In one example, a single resonant element can be individually positioned within a range of 2.5 cm radially. In addition to individual resonant element adjustment, a group of elements can be repositioned as a unit. In this manner, the coil geometry can be changed between a minimal setting of 22 cm in the long axis (top-bottom) and 16 cm in the short axis (left-right) to a maximal geometry of 26 cm by 21 cm. In addition to radial control of all resonant elements coupled to end plates 415A and 415B, individual resonant element holders can be separately adjusted as well. Adjusting screws 410, in radial alignment with the center axis of coil 400, provides individual control of radial position for a particular resonant element holder. In one example, adjusting screws 410 turn in a clearance hole coupled to the frame and matching threads in a resonant element holder engage threads of screw 410. In one example, at least one resonant element is non-adjustable and remains stationary relative to the frame.

In one example, a slot in a portion of the structure is configured to cause the individual resonant elements to move in a radial direction in response to changes in the position of an end ring structure. For example, the end rings are drawn towards or apart from each other by means of a threaded shaft. The threaded shaft turns in a bushing on one end ring and engages threads on the other end ring. Rotation of a knob fixed on an end of the threaded rod causes the rings to move in an axial direction (relative to the coil axis), and thus, causes the resonant elements of that group to move in a radial direction. The slot in the structure is engaged by a pin in a complementary portion of the resonant element carrier structure.

Figure 5:
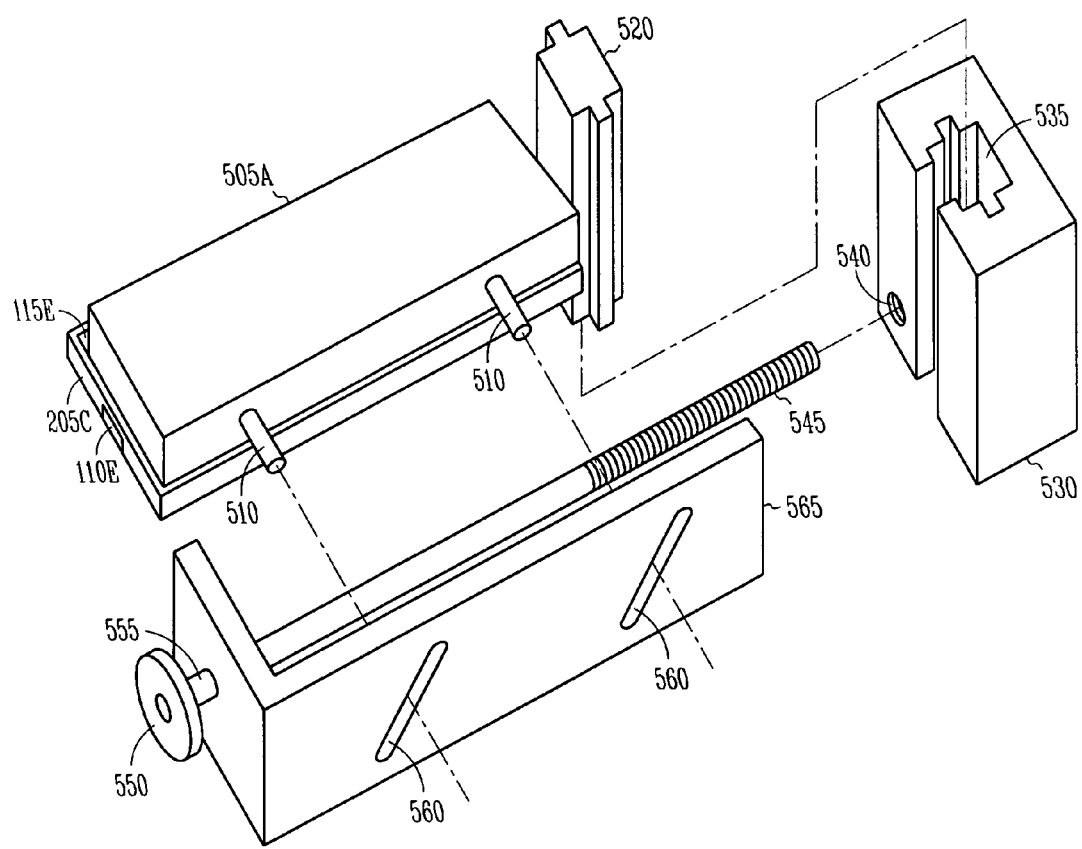
FIG. 5 illustrates a perspective view of a resonant element holder.

FIG. 5 illustrates a structure for positioning a resonant element according to one example, however it is understood that other structures (flexible or rigid) can be used to carry the plurality of resonant elements of a coil. Resonant element 205C includes inner conductor 110E and ground plane 115E. Ground plane 115E is a planer structure with metal foil on a single side of a dielectric. Resonant element 205C is carried by resonant element holder 505A. Resonant element holder 505A includes pins 510 and guide 520 having a particular configuration to control movement of resonant element holder 505A. Guide 520 limits movement to a radial direction relative to the axis of coil 400, for example. Guide 520 engages channel 535 of end portion 530. In one example, end portion 530 is integral with end plate 415A or is a separate component affixed to end plate 415A. End portion 530 includes threaded hole 540 to receive threaded shaft 545. Threaded shaft 545 turns in clearance hole 555 of carrier 565 with rotation of knob 550. Carrier 565 includes slots 560 that receive pins 510. Rotation of threaded shaft 545 causes carrier 565 and end portion 530 to draw nearer or farther apart. As carrier 565 and end portion 530 move relative to each other, resonant element holder 505A moves upward or downward in a radial direction, thus also moving resonant element 205C radially.

Figure 6:
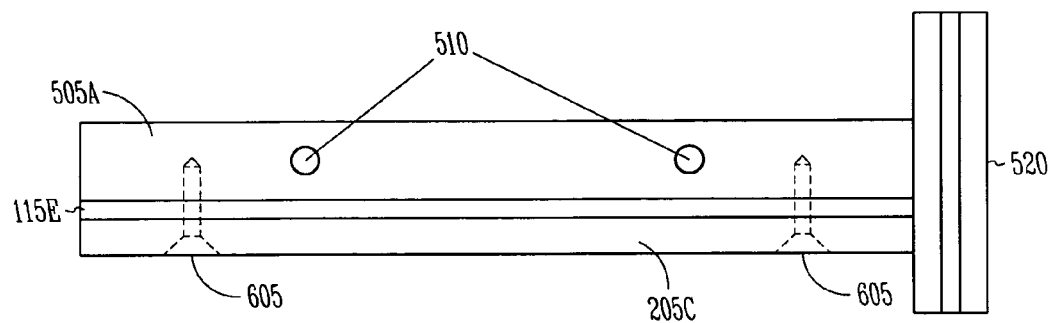
FIG. 6 illustrates a side view of a resonant element holder.

FIG. 6 illustrates a side view of resonant element holder 505A affixed to guide 520 and having resonant element 205C affixed to a surface. Resonant element 205C is affixed to holder 505A by threaded fasteners 605. Other means of attachment area also contemplated, including rivets, clips, adhesive and other structures. In one example, the resonant element itself includes the structure to control radial movement.

Other means of causing one or more resonant elements to move in a radial direction are also contemplated, including for example, a wedge configuration and a spring (non-magnetic) a cam and follower or suitable gears and linkages. A system having one or more mechanical links can be used to adjust the position of the resonant elements as described herein.

In one example, a radial position of each resonant element is individually adjustable by means of threaded adjustors. In addition, two or more resonant elements are moved in a radial direction in unison by means of mechanical linkages or couplings. The mechanical linkages or couplings can be disposed at one or both end rings. Those resonant elements moving in unison can be disposed about the coil in any manner. For example, a group of three adjacent resonant elements can be moved as a unit or a group of three equally spaced resonant elements (having non-group member resonant elements disposed there between) can be moved as a unit. In one example, those resonant elements that are configured to move as a unit are coupled to an end plate structure having threaded holes for engagement of a threaded shaft and those resonant elements that are not part of the group are coupled to a separate end plate structure having holes that do not engage the threaded shaft.

In one example, the resonant elements are evenly spaced by the frame to allow for minimum coil geometry (16 cm by 22 cm). In one example, a head coil frame allows for patient positioning outside the coil. The frame has a firm portion to support the back of the subjects head. The firm portion includes a 10 cm wide 18 cm long curved section (radius=10 cm) of ¼" thick plastic. In one example, the plastic includes an acetal resin or homopolymer such as Delrin (Dupont). In one example, the firm holder section is combined with a flexible portion using $\frac{1}{16}$" thick Teflon. The head holder is attached to the table bed and allows for adjustments of the holder height along the y-axis by ±2 cm. In this way, the subject can be centered in the coil based on individual head size. Foam cushion material disposed around the inside of the head holder improves patient comfort and provides a minimal distance of 1.5 cm from the resonance elements. In one example, the coil includes 32 resonant elements and is coupled to a 32-channel digital receiver system.

In one example of the present subject matter, transmit phase increments for each channel of a multi-channel coil can be adjusted for image homogeneity by altering the cable length in the transmit path. The decoupling capacitor patches located between neighboring coils and close to the capacitive feed-points (as shown in FIG. 3 for example) averts RF peak splitting while allowing for coil size changes. In one example, decoupling adjustment can be established for an unloaded coil. A load (such as a spherical phantom of 3 L, 90 mM saline or a human head) primarily dampens next neighbor (resonant element) coupling. The initial value of the variable capacitive patches can be established on a bench using an unloaded coil. In one example, initial decoupling capacitor values (for reducing next neighbor coupling for different coil geometries) were determined experimentally. The values of a capacitor in the decoupling network can be measured with an LCR meter (Fluke 6303A) by electrically isolating the capacitor from the resonance circuitry. The actual decoupling capacitor values can be established by adjustment of the copper width and overlap for the patch capacitors between the resonance elements. In one example, and using various subject head sizes, the array elements are independently tuned and matched from one another for 50Ω match without change of the decoupling capacitor network. In one example, tuning capacitors are disposed at the ends of each transmission line element and the value is adjusted to select a particular resonant frequency. The tuning capacitor is coupled between the inner and outer conductor of the resonant element.

ADDITIONAL EXAMPLES

In various examples of the present subject matter, one or more of the resonant elements are repositionable along a radial axis or along an axial axis. In various examples, the alignment or orientation of one or more resonant elements is selectable to accommodate different head and body shapes and sizes. The adjustable configuration of the present subject matter allows for a reduced void or gap between the coil and the target specimen.

Figure 7:
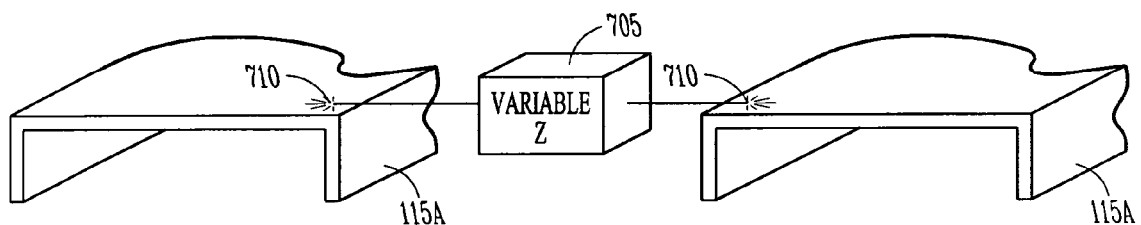
FIG. 7 illustrates a model of two resonant elements.

In one example, a variable impedance is coupled between adjacent resonant elements to provide controlled coupling, as shown in FIG. 7. In the figure, ground planes 115A are coupled by variable impedance 705. Variable impedance 705 is electrically bonded by solder connections 710 in the example illustrated. Examples of variable impedances include a variable inductor and a variable capacitor. The amount of impedance coupling between adjacent resonant elements can be tailored for a particular situation. For instance, more coupling capacitance may be used when adjacent resonant elements are positioned more closely and less capacitance is used when farther apart.

In general, a coupling capacitor is positioned at a point along the length of the resonant element where the voltage is at a high level, which typically coincides with the endpoints of the resonant elements. In general, a coupling inductor is positioned at a point along the length of the resonant element where the current is at a high level, which typically coincides with the middle of the resonant elements. In various examples, multiple decoupling capacitors or inductors are coupled between selected resonant elements at various locations. For example, a particular coil includes a pair of decoupling capacitors between each resonant element, where each resonant element has a capacitor at each end.

In addition to transmit coils, the present subject matter can be applied to a receive-only array. In one example, a receive-only array (coil) includes a number of short transmission line (resonant) elements and is particularly suited to use at higher frequencies where the relative close RF ground plane has a reduced effect on the overall coil performance. In one example, a closer coil setting can cause some local signal cancellation. The cancellation is a transmit phase effect and can be corrected through RF phase shimming.

Figure 8:
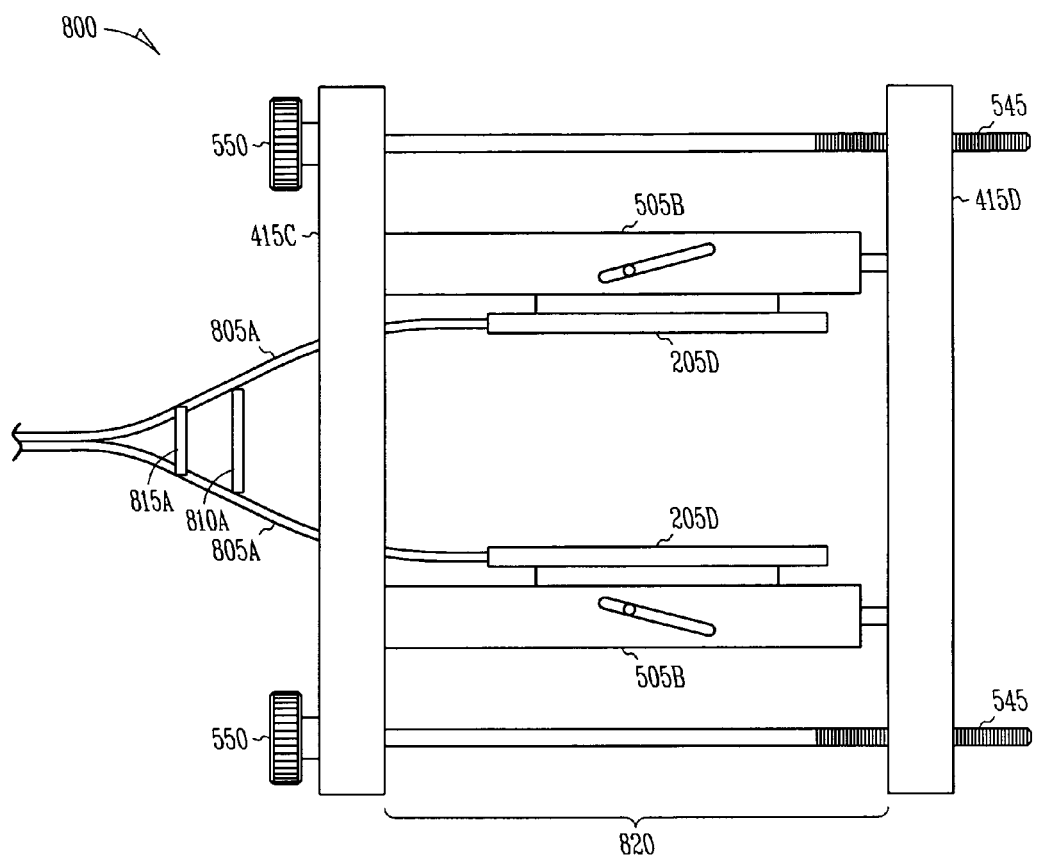
FIG. 8 illustrates a side view of a coil.

FIG. 8 illustrates a side view of coil 800 having two resonant elements 205D arranged in a volume coil configuration according to an exemplary embodiment. Resonant elements 205D are carried by resonant element holders 505B having diagonally aligned slots that engage pins for control of radial position. End plates 415C and 415D are moved relative to each other by means of threaded shaft 545 turned by knob 550, thus controlling dimension 820.

Resonant elements 205D are coupled to coaxial lines 805A, which extend through an opening in end plate 415C. Coaxial lines 805A are gathered in a manner controlled by spreader 810A. Spreader 810A urges coaxial lines 805A apart while shorting ring 815A cinches coaxial lines 805A together. Spreader 810A, in one example, includes an insulative disk or other structure. Shorting ring 815A is electrically coupled to the shield conductor of coaxial lines 805A.

In one example, each resonant element is coupled to a transmit/receive switch, a transmitter, receiver or a transceiver. In one example, the connection includes a bundle of coaxial lines, each separately coupled by an electrical connection with a resonant element in the form of a transmission line.

In one example, the bundle of coaxial lines is gathered in a manner to provide a reflective end cap and at the same time serve as a sleeve balun. A sleeve balun does not transform the impedance and is coupled to the outer conductor of the coaxial line at a distance of approximately ¼λ (where λ represents the wavelength) from the feed point. The center conductor of the coaxial line is coupled to the resonant element by a matching capacitor connected in series. Each resonant element can be modeled as a ½λ antenna or transmission line.

In one example, a conductive shorting ring encircles the bundle of coaxial lines at a location ¼λ from the resonant elements. The shorting ring is electrically coupled to the outer (shield) conductor of the coaxial lines. Sheet currents present in the end cap region (between the shorting ring and the resonant elements) affect the coil performance. In particular, an additive B field effect is noticed in the end cap region. For example, by controlling the shape of the end cap (namely, adjusting the profile of the coaxial line path), the B field intensity is changed which results in changes to the homogeneity and therefore, the field of view. In one example, the field of view increases by converging the wire bundle at a point closer to the resonant elements. In one example, the profile of the coaxial line path is controlled by means of an inuslative spreader disk located on the interior of the bundle. The spreader disk (bakelite, Teflon, Delrin for example) is coupled to each coaxial line by a plastic fastener or cable clamp. At particular frequencies (for example low frequencies), the conductive shorting ring can be segmented and coupled using a capacitor (for example, 330 pF) to avoid gradient induced eddy currents.

The wire bundle structure serves as a sleeve balun in the region between the shorting ring and the resonant elements (to reduce any sheet currents) and serves as a reflective endcap (to improve homogeneity) in the portion near the coil.

Figure 9:
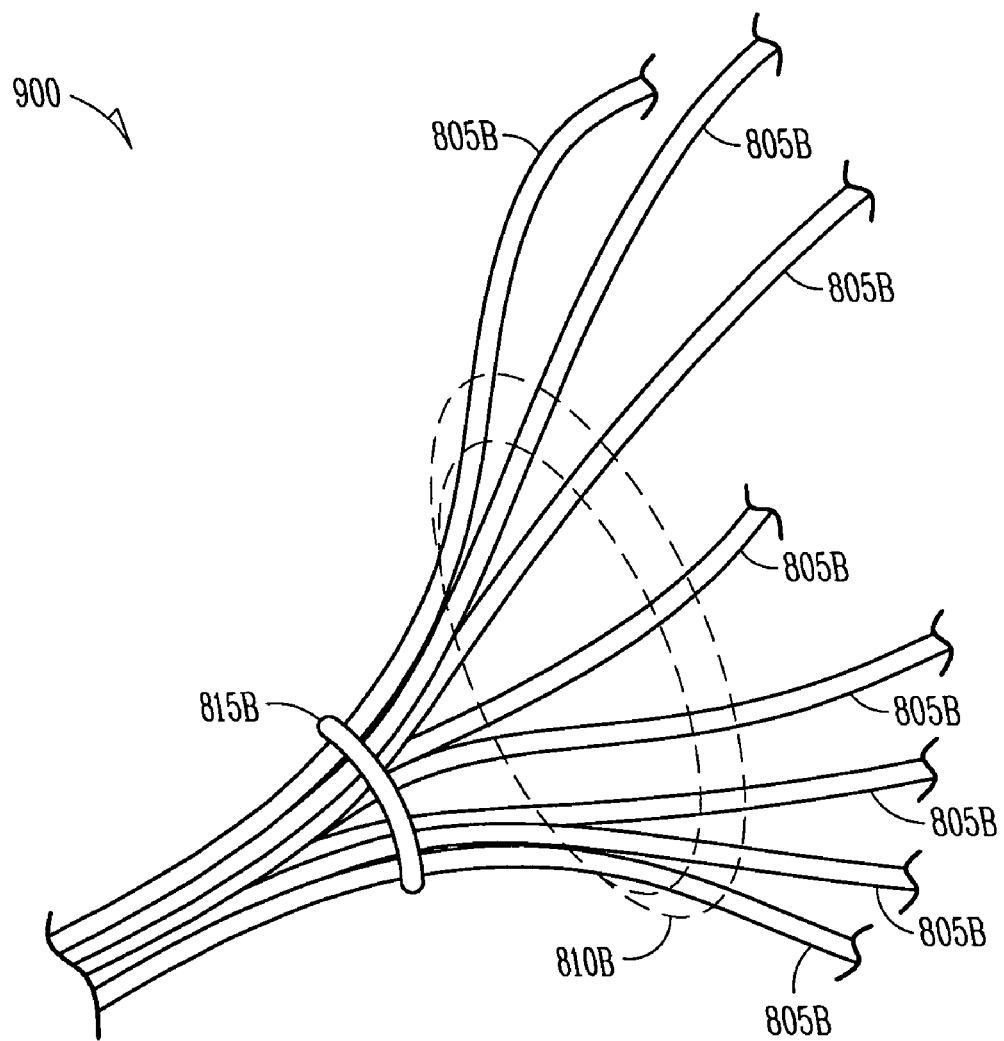
FIG. 9 illustrates a perspective view of a coaxial bundle.

FIG. 9 illustrates bundle 900 having individual coaxial lines 805B spaced apart by spreader 810B and shorted by shorting ring 815B.

The present subject matter includes a geometrically adjustable transceiver array based on decoupled linear transmission line (resonant) elements. A mechanical holder enables controlled placement of individual resonant elements as well as controlled placement of grouped resonant elements. A self-adjusting decoupling impedance is coupled between adjacent resonant elements and provides an impedance value that changes as a function of the space between the adjacent resonant elements. This configuration allows an operator, for example, to rapidly adjust the coil configuration in a clinical setting without requiring manual adjustment and calibration of decoupling capacitors.

Individual match and tune impedance elements for each resonant element provides good coil efficiency and SNR. Resonant element decoupling, in the order of −14 dB or higher, can be achieved using an adjustable transmit array coil of the present subject matter. In one example, the decoupling capacitor network does not need additional adjustment following a change of coil size. Compared to a fixed array coil, the present subject matter provides improved peripheral SNR, transmit efficiency and parallel imaging performance.

In addition, parallel imaging performance is improved using a resonant element having a ground plane on three sides as illustrated in FIG. 1A. Such a ground plane provides improved element decoupling and improved coil sensitivity profiles. Gains in sensitivity and transmit efficiency for the adjustable array can be attributed to better coil-to-sample coupling and higher $B_1$ sensitivity closer to the resonance elements. One example of the coil allows for flexibility in transmit phase and amplitude as well as excitation with, for instance, sixteen independent RF waveforms. This can be beneficial for controlling potentially destructive transmit phase interferences depending on coil size and coupling.

In one example, the frame includes a plurality of holders each of which are configured to carry a resonant element. At least some of the holders are individually and collectively repositionable as described herein. Resonant elements are coupled to the holders by mechanical fasteners (such as screws or rivets) or other structural features (such as shaped sections).

Figure 10A:
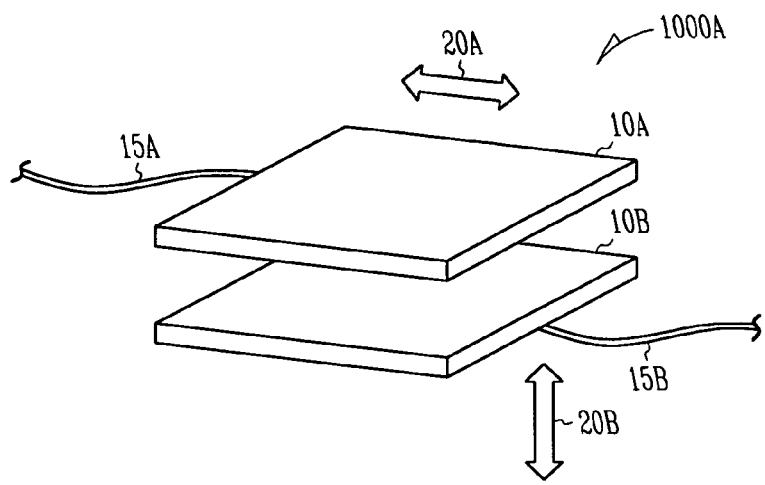
FIGS. 10A, 10B and 10C illustrate variable impedances.

FIG. 10A illustrates a schematic of patch capacitor 1000A. Patch capacitor 1000A, also referred to as a decoupling capacitor, and includes conductive plates 10A and 10B separated by a dielectric. The dielectric can be air, a gas or other insulative material. Relative movement of plates 10A and 10B in the directions indicated by arrows 20B and 20A will affect the capacitance value. Conductive traces 15A and 15B provide electrical connections the resonant elements.

Figure 10B:
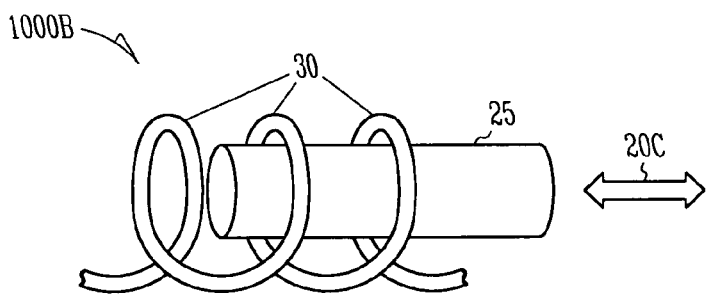

FIG. 10B illustrates a schematic of decoupling inductor 1000B. Inductor 1000B includes three windings 30 and core 25 disposed partially in the interior. Relative movement of windings 30 and core 25 in the direction indicated by arrow 20C will affect the inductive value.

Figure 10C:
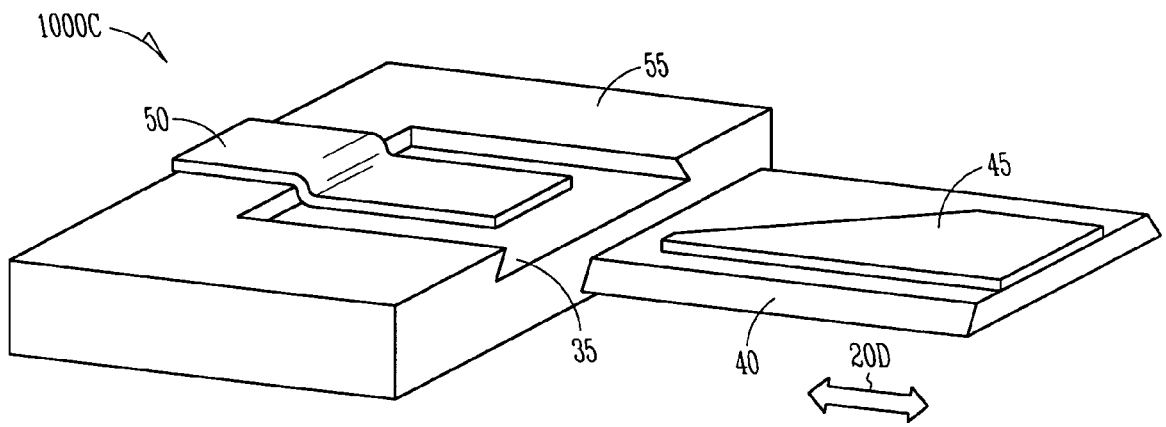

FIG. 10C illustrates a view of exemplary patch capacitor 1000C. In the figure, insulative block 55 includes channel 35 configured to receive slide plate 40. Conductive foil 50 is adhesively bonded to a surface of channel 35. In addition, conductive foil 45 is adhesively bonded to a surface of slide plate 40. Relative movement of slide plate 40 and block 55 in the direction indicated by arrow 20D will affect the capacitance value. In one example, conductive foils 50 and 45 are electrically coupled to ground planes of adjacent resonant elements.

An exemplary capacitive patch includes a 2 mm thick dielectric substrate of 15 mm width coupled to a side of each resonant element. The dielectric substrate can include an insulative material such as a polymer (i.e. Teflon), glass or quartz. An adjacent dielectric substrate has a groove with corresponding dimensions to guide the 2 mm thick dielectric substrate and allow for variability based on the distance between adjacent resonant elements. An adhesive-backed copper tape (or foil) of 12 mm width disposed in the bottom of the groove is soldered to the output circuitry for each element as shown. The copper tape is configured in a manner to generate a capacitive function that correlates capacitance with coil size (namely, the spacing between adjacent resonant elements).

In one example, a capacitive patch includes a 2 mm thick Teflon substrate of 15 mm width attached to one side of a Teflon bar. The adjacent Teflon bar element includes a corresponding structure that guides the 2 mm Teflon patch and allows for variability depending on the distance between the resonant elements. An adhesive-backed copper tape of 12 mm width disposed in the bottom of the groove is soldered to the output circuitry for each resonant element as shown. The copper tape is configured in a manner to generate a capacitive function that matches the predetermined decoupling capacitor needs for various coil sizes. For example, a generally rectangular profile of copper tape will provide linear relationship between movement of the patch elements and capacitance. Other profiles that provide different functions are also contemplated, including triangular, segmented or curved foil shapes.

In other examples, the variable capacitor is configured to change spacing between conductive plates of a capacitor while the overlap (area) remains constant. In one example, a position of a dielectric is changed based on the position of the resonant elements, thus changing the coupling capacitance.

In one example, a variable inductance is configured to change inductance as a function of the distance between adjacent resonant elements. For example, inductance can be varied by inserting or withdrawing a core in the windings. As such, the resonant elements are coupled to a linkage that controls the position of a core relative to an inductor winding and thus, the coupling between the adjacent resonant elements can be changed. In one example, the space between adjacent windings, or loops, or the diameter of the windings of an inductor are varied to change the inductance as a function of distance between resonant elements. For example an inductor having flexible windings can be stretched or allowed to compress by a linkage coupled to the adjacent resonant elements, thus changing the inductance based on the resonant element spacing. A system according to the present subject matter includes a coil as described herein as well as a processor or computer connected to the coil. The computer has a memory configured to execute instructions to control the coil and to generate magnetic resonance data. For example, the coil can be controlled to provide a particular RF phase, amplitude, pulse shape and timing to generate magnetic resonance data. The computer is coupled to a user-operable input device such as a keyboard, a memory, a mouse, a touch-screen or other input device for controlling the processor and thus, controlling the operation of the coil. In addition, the system includes an output device coupled to the processor. The output device is configured to generate a result as a function of the user selection. Exemplary output devices include a memory device, a display, a printer or a network connection.

In one example, the frame of the coil is controlled by actuators driven by the processor. For example, a keyboard entry by a user can be configured to control the spacing of adjacent resonant elements.

Figure 11:
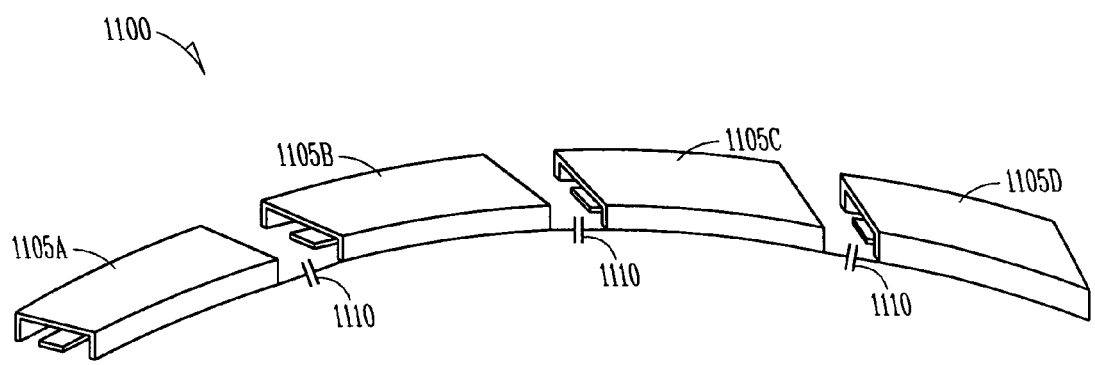
FIG. 11 includes a curved row of resonant elements.

FIG. 11 illustrates row 1100 of resonant elements of a coil according to one example of the present subject matter. In the figure, row 1100 includes four discrete resonant elements 1105A, 1105B, 1105C and 1105D aligned end-to-end. Capacitor 1110 are electrically coupled between adjacent resonant elements. In one example, capacitors 1110 have a fixed value for a particular application. Each resonant element, such as 1105A, has a curved profile. In one example, the curvature is fixed and the angular alignment of the resonant element is determined by an adjusting screw (i.e. screws 410 of FIG. 4B) or other structure. In one example, the resonant element is flexible and the curvature is determined by an adjusting screw (i.e. screws 410 of FIG. 4B) or other structure. The dielectric for each resonant element illustrated is omitted in the figure for clarity and each resonant element is represented as a strip line conductor having a ground plane disposed on three sides and a strip inner conductor.

Figure 12:
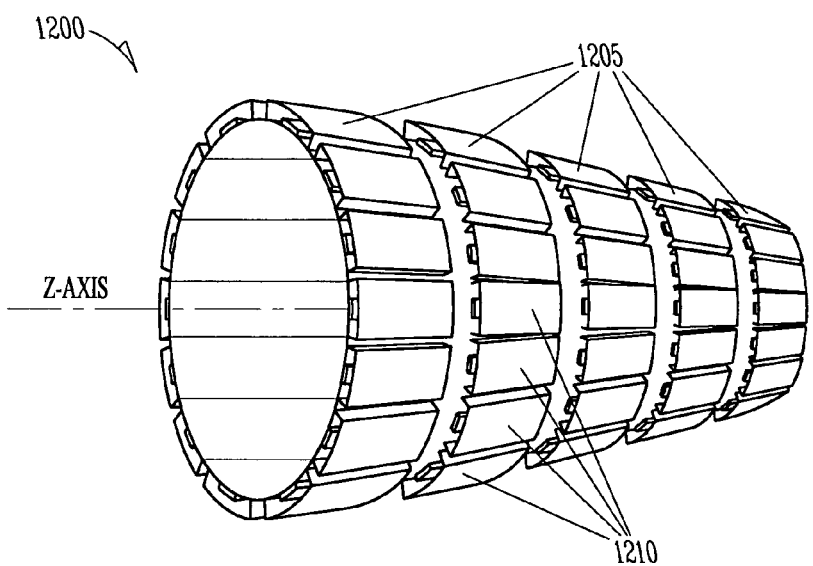
FIG. 12 includes a volume coil having a curved profile.

FIG. 12 includes volume coil 1200 having a curved profile relative to the z-axis. For example, coil 1200 can be configured for extremity imaging or for breast imaging. Resonant elements 1205 are aligned in a row, an example of which is shown in FIG. 11. Resonant elements 1210 are aligned in a rank. The dielectric for each resonant element illustrated is omitted in the figure for clarity and each resonant element is represented as a strip line conductor having a ground plane disposed on three sides and a strip inner conductor. The resonant elements of coil 1200 can be of uniform size and configuration or of different size and configuration. For example, the resonant elements of a first rank can have a particular size and curvature that differs from those resonant elements of a second rank. The resonant elements of coil 1200 can be supported by an adjustable frame as illustrated in FIG. 4 or coupling to a flexible material.

Figure 13:
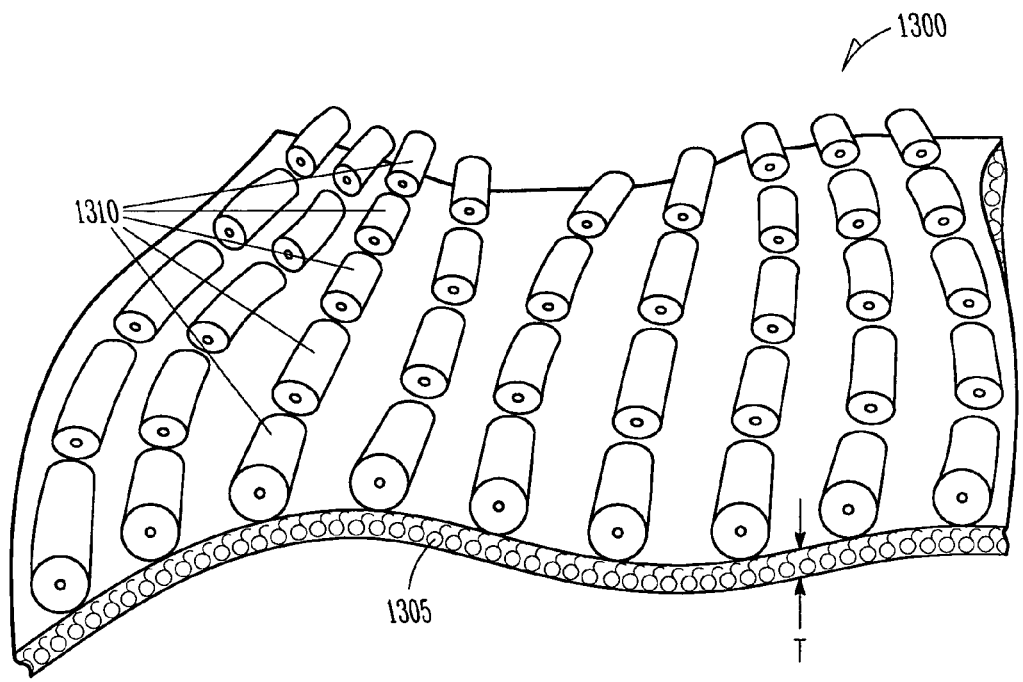
FIG. 13 includes a segment of a flexible material having a plurality of resonant elements.

FIG. 13 includes segment 1300 of flexible material 1305 having a plurality of resonant elements 1310 mounted thereon. In the figure, resonant elements 1310 are aligned in rows with each resonant element in a row coupled together by an impedance element (omitted in the figure for clarity). The impedance element, such as capacitor 1110 of FIG. 11, can have a fixed or variable value. In addition, adjacent resonant elements can be coupled or decoupled together by a fixed or variable impedance element, as illustrated in FIG. 7.

The resonant elements are affixed to material 1305 by an adhesive bond or by mechanical fasteners. In one example, resonant elements 1310 are embedded in the thickness of material 1305. In one example, thickness T of material 1305 establishes a distance between the resonant element and the subject under study. A uniform thickness T facilitates uniform spacing. Resonant elements 1310 are illustrated as short coaxial line segments. In one example, material 1305 includes a fabric (woven or non-woven) or mesh of flexible fibers. In one example, material 1305 is a flexible plastic or polymer sheet. Material 1305 can be configured as a cylinder or a planer surface. In one example, coil 1300 includes a plurality of resonant elements and a fabric configured as a wearable garment such as a hat, a vest or a sleeve.

Figure 14:
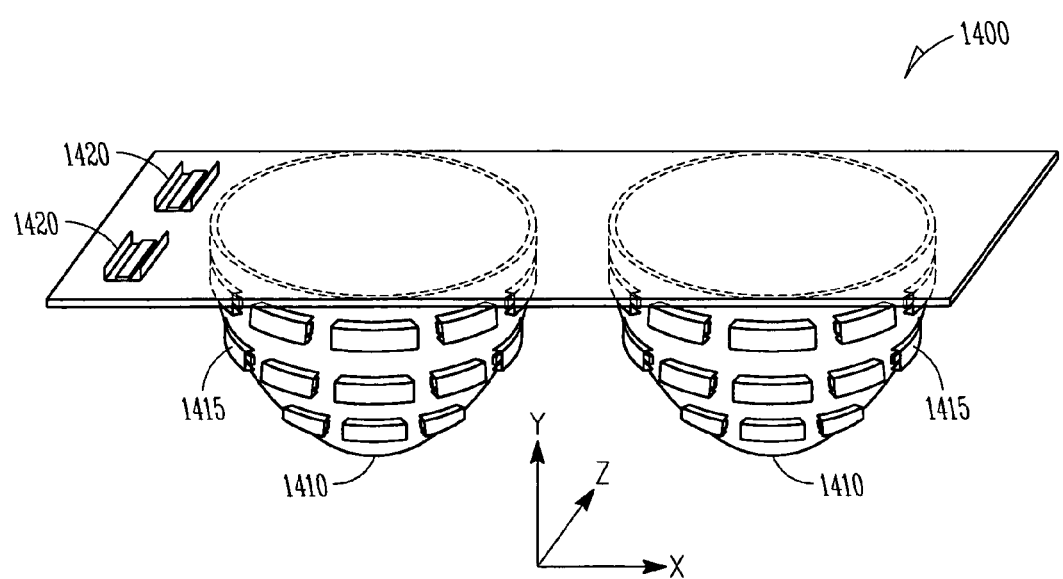
FIG. 14 includes an exemplary coil for breast imaging.

FIG. 14 includes breast coil 1400 according to another example of the present subject matter. Coil 1400 includes two breast cups 1410 having a plurality of resonant elements 1415 distributed about an exterior surface. Resonant elements 1415 are in rows about the y-axis and in various embodiments, are affixed to a mesh, fabric or other structure to hold the form illustrated. In addition, resonant elements 1420 are positioned in a manner sensitive to a particular target site. In the example illustrated, resonant elements 1420 are sensitive to the lymph node region on one side. Additional resonant elements and additional targeted areas can be provided. An array of more than two resonant elements, for example, at the lymph node site, is also contemplated. In one example, breast coil 1400 is fabricated of flexible material including foam. In one example, the resonant elements are embedded in foam or are flush with a surface of the foam.

CONCLUSION

It is to be understood that the above description is intended to be illustrative, and not restrictive. For example, the above-described embodiments (and/or aspects thereof) may be used in combination with each other. In addition, numbers (such as elements and channels), values (such as capacitance values, frequencies and physical dimensions) can be different than that provided in the examples herein. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separate embodiment.

What is claimed:

1. A magnetic resonance imaging device comprising:
   a plurality of resonant elements, each resonant element configured to resonate at a particular frequency; and
   a frame having a plurality of element holders coupled by a link, wherein each element holder is configured to retain a resonant element and wherein the link is configured to retain each of the element holders in one of a plurality of radial positions relative to at least one other element holder determined as a function of a user selection.

2. The device of claim 1 wherein the frame includes a movable end plate, the position of which determines the position of at least one element holder.

3. The device of claim 2 wherein the movable end plate is coupled to a threaded shaft.

4. The device of claim 1 wherein the link includes a secondary adjustment for control of position of at least one element holder independent of a position of another element holder.

5. The device of claim 1 wherein the link includes a cam.

6. The device of claim 1 wherein the plurality of resonant elements are arranged about a volume.

7. The device of claim 1 further including an impedance element disposed between adjacent resonant elements.

8. The device of claim 7 wherein the impedance element includes a variable impedance.

9. The device of claim 8 wherein the variable impedance includes at least one of a capacitor and an inductor.

10. A magnetic resonance imaging device comprising:
a plurality of resonant elements, each resonant element configured to resonate at a particular frequency;
an impedance element disposed between adjacent resonant elements, the impedance element including a variable impedance; and
a frame having a plurality of element holders coupled by a link; wherein each element holder is configured to retain a resonant element and wherein the link is configured to retain the element holders in one of a plurality of radial positions determined as a function of a user selection, and further wherein the variable impedance has an electrical characteristic that varies as a function of alignment of the first element holder relative to the second element holder.

11. A magnetic resonance imaging system comprising:
a coil having a plurality of resonant elements distributed about a volume, wherein a radial position of at least one resonant element of the plurality of resonant elements, relative to at least one other resonant element, is user selectable;
a processor coupled to the coil and having executable instructions stored in a memory accessible to the processor;
a user-operable input device coupled to the processor and configured to receive a user selection for operation of the coil; and
an output device coupled to the processor, the output device configured to generate a result as a function of the user selection.

12. The system of claim 11 wherein the coil further includes at least one adjustable linkage coupled to at least two resonant elements of the plurality of resonant elements.

13. The system of claim 11 wherein the processor is coupled to the at least one adjustable linkage.

14. The system of claim 11 wherein the user-operable input device is coupled to the at least one adjustable linkage.

15. The system of claim 11 further including a variable impedance coupled between at least two resonant elements of the plurality of resonant elements.

16. The system of claim 15 wherein the variable impedance is controlled by a distance between the at least two resonant elements.

17. A magnetic resonance imaging system comprising:
a coil having a plurality of resonant elements distributed about a volume, wherein a position of at least one resonant element of the plurality of resonant elements, relative to at least one other resonant element, is user selectable;
a variable impedance coupled between at least two resonant elements of the plurality of resonant elements, wherein the variable impedance is controlled by, and is a linear function of, a distance between the at least two resonant elements;
a processor coupled to the coil and having executable instructions stored in a memory accessible to the processor;
a user-operable input device coupled to the processor and configured to receive a user selection for operation of the coil; and
an output device coupled to the processor, the output device configured to generate a result as a function of the user selection.

18. A magnetic resonance imaging system comprising:
a coil having a plurality of resonant elements distributed about a volume, wherein a position of at least one resonant element of the plurality of resonant elements, relative to at least one other resonant element, is user selectable;
a variable impedance coupled between at least two resonant elements of the plurality of resonant elements, wherein the variable impedance is controlled by, and is a non-linear function of, a distance between the at least two resonant elements;
a processor coupled to the coil and having executable instructions stored in a memory accessible to the processor; a user-operable input device coupled to the processor and configured to receive a user selection for operation of the coil; and
an output device coupled to the processor, the output device configured to generate a result as a function of the user selection.

19. A magnetic resonance imaging system comprising:
a coil having a plurality of resonant elements distributed about a volume, wherein a position of at least one resonant element of the plurality of resonant elements, relative to at least one other resonant element, is user selectable;
a plurality of signal lines wherein each resonant element is coupled to a signal line of the plurality of signal lines, a processor coupled to the coil and having executable instructions stored in a memory accessible to the processor;
a user-operable input device coupled to the processor and configured to receive a user selection for operation of the coil; and
an output device coupled to the processor, the output device configured to generate a result as a function of the user selection.

20. The system of claim 19 wherein each signal line includes a ground conductor and wherein each ground conductor is coupled together by a shorting conductor.

21. The system of claim 20 wherein a distance between the shorting conductor and a resonant element is approximately one quarter wavelength of the resonant frequency.

22. The system of claim 19 wherein the plurality of signal lines are configured as a function of a field of view of the coil.

23. A method for magnetic resonance imaging comprising: positioning a plurality of resonant elements about a volume, each resonant element configured to resonate at a particular frequency; and adjusting a user-operable control to cause at least one resonant element to move in a direction independent of at least one other resonant element.

24. The method of claim 23 wherein adjusting includes changing a variable impedance component between the at least one resonant element and the at least one other resonant element.

25. A method for magnetic resonance imaging comprising: positioning a plurality of resonant elements about a volume, each resonant element configured to resonate at a particular frequency; and adjusting a user-operable control to cause at least one resonant element to move in a radial direction independent of at least one other resonant element, wherein adjusting includes changing a variable impedance component between the at least one resonant element and the at least one other resonant element, and further wherein changing the variable impedance component includes moving a capacitor plate.

26. A method for magnetic resonance imaging comprising positioning a plurality of resonant elements about a volume, each resonant element configured to resonate at a particular frequency; adjusting a user-operable control to cause at least one resonant element to move in a direction independent of at least one other resonant element; and adjusting homogeneity of the plurality of resonant elements by positioning a bundle of coaxial lines, each coaxial line coupled to a resonant element.

* * * * *

UNITED STATES PATENT AND TRADEMARK OFFICE
CERTIFICATE OF CORRECTION

PATENT NO.         : 7,514,926 B2  
APPLICATION NO.    : 11/599177  
DATED              : April 7, 2009  
INVENTOR(S)        : Gregor Adriany et al.

Page 1 of 1

It is certified that error appears in the above-identified patent and that said Letters Patent is hereby corrected as shown below:

In the Specification:

In Column 1, Lines 12 to 16 delete the following:

"This work was supported by NIH grant P41 RR08079, W.M. Keck Foundation, and the MIND Institute, the Keck Foundation, NSF grant 9907842, and NIH grant SIO RR1395. The United States government has certain rights in the technology disclosed herein."

and add the following:

--This invention was made with government support under P41-RR008079, CA076535, EB000331, and EB000513 awarded by the National Institutes of Health. The government has certain rights in the invention.--

Signed and Sealed this  
Thirtieth Day of April, 2013

Teresa Stanek Rea  
*Acting Director of the United States Patent and Trademark Office*